US005872338A

United States Patent [19]
Lan et al.

[11] Patent Number: 5,872,338
[45] Date of Patent: Feb. 16, 1999

[54] MULTILAYER BOARD HAVING INSULATING ISOLATION RINGS

[75] Inventors: James J. D. Lan, Fremont; Steve S. Chiang, Saratoga; Paul Y. F. Wu; John Y. Xie, both of San Jose, all of Calif.

[73] Assignee: Prolinx Labs Corporation, San Jose, Calif.

[21] Appl. No.: 631,875

[22] Filed: Apr. 10, 1996

[51] Int. Cl.⁶ ............................................. H05K 1/03
[52] U.S. Cl. ..................... 174/255; 154/260; 154/261; 361/777
[58] Field of Search ..................... 174/250, 255, 174/262, 264, 265, 261; 361/760, 772, 774, 777, 779; 228/179.1, 180.22; 257/700, 723, 724, 698; 437/183; 439/68, 83; 333/238, 246

[56] References Cited

U.S. PATENT DOCUMENTS

| 3,335,327 | 8/1967 | Damon et al. |
| 3,384,879 | 5/1968 | Stahl et al. |

(List continued on next page.)

FOREIGN PATENT DOCUMENTS

| 0336359 | 10/1989 | European Pat. Off. |
| 510900-A2 | 10/1992 | European Pat. Off. |
| 59-13368 | 1/1984 | Japan. |
| 61-287152A | 12/1986 | Japan. |

OTHER PUBLICATIONS

"Process Considerations In Restructurable VLSI For Wafer–Scale Integration", P. W. Wyatt, etc., IEDM, Dec. 1984, pp. 626–629.

"A Laser Linking Process For Restructurable VLSI", G. H. Chapman, etc., CLEO, Apr., 1982, pp. 1–4.

"Taiyo PSR–400 Photoimageable Solder Mask (Two–Part Aqueous Developing System", Taiyo America, Inc., Feb. 1992, pp. 1–8.

"Ball Grid Array Technology", John H. Lau, McGraw–Hill, Inc., Dec. 1995, p. 38.

Hwang, Jennie S., "Solder Paste in Electronics Packaging Technology and Applications in Surface Mount, Hybrid Circuits, and Component Assembly", Van Nostrand Reinhold, Dec. 1992, pp. xv–xx and 59–62.

"Polyswitch Resettable Fuses for Circuit Protection Information Package", Raychem Corporation, Electronics Division, Nov., 1992.

G.R. Ruschau et al., "Critical Volume Fractions in Conductive Composites", Journal of Composite Materials, vol. 26, No. 18/1992, pp. 2727–2735.

S. Chiang, et al., "Conductive Channel in ONO Formed by Controlled Dielectric Breakdown", Dec. 1992 Symposium on VLSI Technology Digest of Technical Papers, pp. 20–21.

(List continued on next page.)

Primary Examiner—Kristine L. Kincaid
Assistant Examiner—Kamand Cuneo
Attorney, Agent, or Firm—Skjerven, Morrill, MacPherson, Franklin & Friel LLP; Alan H. MacPherson; Omkar K. Suryadevara

[57] ABSTRACT

A structure includes a support layer formed of a conductive material, such as a sheet of copper. The support layer has a number of conductive islands isolated from other portions of the support layer by isolation gaps. The support layer is sandwiched between two compound layers each of which is formed of a dielectric layer having a number of via holes and conductive elements located in the via holes. The conductive elements are formed at predetermined locations such that a conductive element in each compound layer contacts a conductive island in the support layer. The structure also includes two conductive layers formed on the two respective compound layers such that a trace in a first conductive layer is coupled to a trace in a second conductive layer through two conductive elements in the respective two compound layers and an island in the support layer. Such a structure can be formed by a number of processes. For example, the support layer can be formed by etching a sheet of conductive material, the compound layers can be formed by placing a conductive paste in via holes in a dielectric layer, and the conductive layers can be formed by lamination followed by etching to form traces.

20 Claims, 10 Drawing Sheets

U.S. PATENT DOCUMENTS

| | | | |
|---|---|---|---|
| 3,615,913 | 10/1971 | Shaw | 148/33.3 |
| 3,808,576 | 4/1974 | Castonguay et al. | 338/309 |
| 3,857,683 | 12/1974 | Castonguay | 29/195 |
| 3,923,359 | 12/1975 | Newsam | 339/17 M |
| 4,024,629 | 5/1977 | Lemoine et al. | 29/825 |
| 4,090,667 | 5/1978 | Crimmins | 339/19 |
| 4,146,863 | 3/1979 | Mollenhoff | 337/296 |
| 4,238,839 | 12/1980 | Redfern et al. | 365/96 |
| 4,245,273 | 1/1981 | Feinberg et al. | 361/382 |
| 4,247,981 | 2/1981 | Walters | 29/845 |
| 4,386,051 | 5/1983 | Edington | 420/589 |
| 4,399,372 | 8/1983 | Tanimoto et al. | 307/279 |
| 4,413,272 | 11/1983 | Mochizuki et al. | 357/65 |
| 4,420,820 | 12/1983 | Preedy | 365/105 |
| 4,424,578 | 1/1984 | Miyamoto | 365/104 |
| 4,433,331 | 2/1984 | Kollaritsch | 340/825.83 |
| 4,434,134 | 2/1984 | Darrow et al. | 419/5 |
| 4,455,495 | 6/1984 | Masuhara et al. | 307/44 |
| 4,458,297 | 7/1984 | Stopper et al. | 361/403 |
| 4,488,262 | 12/1984 | Basire et al. | 365/104 |
| 4,491,860 | 1/1985 | Lim | 357/68 |
| 4,507,756 | 3/1985 | McElroy | 365/104 |
| 4,507,757 | 3/1985 | McElroy | 365/104 |
| 4,547,830 | 10/1985 | Yamauchi | 361/104 |
| 4,562,639 | 1/1986 | McElroy | 29/584 |
| 4,565,712 | 1/1986 | Noguchi et al. | 427/53.1 |
| 4,566,186 | 1/1986 | Bauer et al. | 29/852 |
| 4,569,120 | 2/1986 | Stacy et al. | 29/574 |
| 4,569,121 | 2/1986 | Lim et al. | 29/574 |
| 4,585,490 | 4/1986 | Raffel et al. | 148/1.5 |
| 4,590,589 | 5/1986 | Gerzberg | 365/100 |
| 4,609,241 | 9/1986 | Peterson | 339/17 CF |
| 4,642,160 | 2/1987 | Burgess | 156/630 |
| 4,651,409 | 3/1987 | Ellsworth et al. | 29/576 B |
| 4,652,974 | 3/1987 | Ryan | 361/395 |
| 4,678,889 | 7/1987 | Yamanaka | 219/121 |
| 4,689,441 | 8/1987 | Dick et al. | 174/68.5 |
| 4,700,116 | 10/1987 | Inoue et al. | 318/254 |
| 4,700,214 | 10/1987 | Johnson | 357/68 |
| 4,710,592 | 12/1987 | Kimbara | 174/68.5 |
| 4,721,868 | 1/1988 | Cornell et al. | 307/465 |
| 4,726,991 | 2/1988 | Hyatt et al. | 428/329 |
| 4,731,704 | 3/1988 | Lochner | 361/400 |
| 4,732,780 | 3/1988 | Mitoff et al. | 427/125 |
| 4,748,490 | 5/1988 | Hollingsworth | 357/51 |
| 4,757,359 | 7/1988 | Chiao et al. | 357/23.5 |
| 4,780,670 | 10/1988 | Cherry | 324/158 |
| 4,786,904 | 11/1988 | Graham, III et al. | 340/825.83 |
| 4,789,760 | 12/1988 | Koyama et al. | 174/68.5 |
| 4,791,075 | 12/1988 | Lin | 437/209 |
| 4,792,646 | 12/1988 | Enomoto | 174/266 |
| 4,792,835 | 12/1988 | Sacarisen et al. | 357/23.6 |
| 4,796,074 | 1/1989 | Roesner | 357/51 |
| 4,796,075 | 1/1989 | Whitten | 357/51 |
| 4,799,128 | 1/1989 | Chen | 361/414 |
| 4,799,984 | 1/1989 | Rellick | 156/89 |
| 4,803,595 | 2/1989 | Kraus et al. | 361/412 |
| 4,808,967 | 2/1989 | Rice et al. | 338/309 |
| 4,821,142 | 4/1989 | Ushifusa et al. | 361/395 |
| 4,823,181 | 4/1989 | Mohsen et al. | 357/51 |
| 4,829,404 | 5/1989 | Jensen | 361/398 |
| 4,839,864 | 6/1989 | Fujishima | 365/200 |
| 4,840,924 | 6/1989 | Kinbara | 437/189 |
| 4,841,099 | 6/1989 | Epstein et al. | 174/68.5 |
| 4,845,315 | 7/1989 | Stopper | 361/428 |
| 4,847,732 | 7/1989 | Stopper et al. | 361/395 |
| 4,864,165 | 9/1989 | Hoberman et al. | 307/467 |
| 4,873,506 | 10/1989 | Gurevich | 337/290 |
| 4,874,711 | 10/1989 | Hughes et al. | 437/8 |
| 4,876,220 | 10/1989 | Mohsen et al. | 437/170 |
| 4,881,114 | 11/1989 | Mohsen et al. | 357/54 |
| 4,882,611 | 11/1989 | Blech et al. | 357/51 |
| 4,888,574 | 12/1989 | Rice et al. | 338/309 |
| 4,888,665 | 12/1989 | Smith | 361/400 |
| 4,892,776 | 1/1990 | Rice | 428/209 |
| 4,893,167 | 1/1990 | Boudou et al. | 357/51 |
| 4,897,836 | 1/1990 | Fitzpatrick et al. | 370/112 |
| 4,899,205 | 2/1990 | Hamdy et al. | 357/51 |
| 4,910,418 | 3/1990 | Graham et al. | 307/465 |
| 4,910,584 | 3/1990 | Mizuo | 257/713 |
| 4,914,055 | 4/1990 | Gordon et al. | 437/192 |
| 4,915,983 | 4/1990 | Lake et al. | 427/98 |
| 4,916,809 | 4/1990 | Boudou et al. | 29/852 |
| 4,920,454 | 4/1990 | Stopper et al. | 361/398 |
| 4,924,287 | 5/1990 | Orbach | 357/51 |
| 4,933,738 | 6/1990 | Orbach et al. | 357/51 |
| 4,935,584 | 6/1990 | Boggs | 174/262 |
| 4,937,475 | 6/1990 | Rhodes et al. | 307/465 |
| 4,940,181 | 7/1990 | Juskey, Jr. et al. | 228/180.21 |
| 4,943,538 | 7/1990 | Mohsen et al. | 437/52 |
| 4,949,084 | 8/1990 | Schwartz et al. | 340/825.83 |
| 4,964,948 | 10/1990 | Reed | 216/18 |
| 4,969,124 | 11/1990 | Luich et al. | 365/201 |
| 4,970,579 | 11/1990 | Arldt et al. | 257/718 |
| 4,974,048 | 11/1990 | Chakravorty et al. | 357/40 |
| 4,977,357 | 12/1990 | Shrier | 338/21 |
| 4,992,333 | 2/1991 | Hyatt | 428/402 |
| 5,003,486 | 3/1991 | Hendel et al. | 364/483 |
| 5,014,002 | 5/1991 | Wiscombe et al. | 324/158 F |
| 5,027,191 | 6/1991 | Bourdelaise et al. | 357/74 |
| 5,030,113 | 7/1991 | Wilson | 439/80 |
| 5,055,321 | 10/1991 | Enomoto et al. | 427/98 |
| 5,055,973 | 10/1991 | Mohsen | 361/414 |
| 5,060,116 | 10/1991 | Grobman et al. | 361/474 |
| 5,068,634 | 11/1991 | Shrier | 338/21 |
| 5,077,451 | 12/1991 | Mohsen | 174/261 |
| 5,087,589 | 2/1992 | Chapman et al. | 438/467 |
| 5,092,032 | 3/1992 | Murakami | 29/830 |
| 5,097,593 | 3/1992 | Jones et al. | 29/852 |
| 5,099,149 | 3/1992 | Smith | 307/465 |
| 5,099,380 | 3/1992 | Childers et al. | 361/56 |
| 5,106,773 | 4/1992 | Chen et al. | 437/51 |
| 5,108,541 | 4/1992 | Schneider et al. | 156/631 |
| 5,120,679 | 6/1992 | Boardman et al. | 437/195 |
| 5,136,366 | 8/1992 | Worp et al. | 257/687 |
| 5,142,263 | 8/1992 | Childers et al. | 338/21 |
| 5,144,567 | 9/1992 | Oelsch et al. | 364/708 |
| 5,148,265 | 9/1992 | Khandros et al. | 357/80 |
| 5,148,355 | 9/1992 | Lowe et al. | 361/778 |
| 5,155,577 | 10/1992 | Chance et al. | 357/71 |
| 5,159,535 | 10/1992 | Desai et al. | 361/751 |
| 5,166,556 | 11/1992 | Hsu et al. | 307/465 |
| 5,170,931 | 12/1992 | Desai et al. | 228/180.22 |
| 5,181,096 | 1/1993 | Forouhi | 257/530 |
| 5,181,859 | 1/1993 | Foreman et al. | 439/225 |
| 5,189,387 | 2/1993 | Childers et al. | 338/20 |
| 5,191,511 | 3/1993 | Sawaya | 361/703 |
| 5,196,724 | 3/1993 | Gordon et al. | 257/530 |
| 5,200,652 | 4/1993 | Lee | 307/465 |
| 5,203,075 | 4/1993 | Angulas et al. | 29/830 |
| 5,210,940 | 5/1993 | Kawakami et al. | 29/852 |
| 5,216,278 | 6/1993 | Lin et al. | 257/688 |
| 5,218,679 | 6/1993 | Hasegawa et al. | 395/275 |
| 5,220,490 | 6/1993 | Weigler et al. | 361/409 |
| 5,229,549 | 7/1993 | Yamakawa et al. | 174/262 |
| 5,233,217 | 8/1993 | Dixit et al. | 257/530 |
| 5,248,517 | 9/1993 | Shrier et al. | 427/58 |
| 5,250,228 | 10/1993 | Baigrie et al. | 252/511 |
| 5,250,470 | 10/1993 | Yamaguchi | 29/832 |
| 5,258,643 | 11/1993 | Cohen | 257/530 |
| 5,260,519 | 11/1993 | Knickerbocker et al. | 174/262 |

| | | | |
|---|---|---|---|
| 5,260,848 | 11/1993 | Childers | 361/127 |
| 5,262,754 | 11/1993 | Collins | 338/21 |
| 5,264,729 | 11/1993 | Rostoker et al. | 257/774 |
| 5,282,271 | 1/1994 | Hsieh et al. | 395/275 |
| 5,282,312 | 2/1994 | DiStefano et al. | 29/830 |
| 5,287,620 | 2/1994 | Suzuki et al. | 29/852 |
| 5,291,062 | 3/1994 | Higgins, III | 257/698 |
| 5,294,750 | 3/1994 | Sakai et al. | 174/52.4 |
| 5,300,208 | 4/1994 | Angelopoulos et al. | 205/50 |
| 5,311,053 | 5/1994 | Law et al. | 257/529 |
| 5,317,801 | 6/1994 | Tanaka et al. | 29/830 |
| 5,319,238 | 6/1994 | Gordon et al. | 257/530 |
| 5,321,322 | 6/1994 | Verheyen et al. | 307/465.1 |
| 5,329,153 | 7/1994 | Dixit | 257/530 |
| 5,345,106 | 9/1994 | Doering et al. | 257/675 |
| 5,346,750 | 9/1994 | Hatakeyama et al. | 313/231.31 |
| 5,347,258 | 9/1994 | Howard et al. | 338/333 |
| 5,349,248 | 9/1994 | Parlour et al. | 307/465 |
| 5,362,676 | 11/1994 | Gordon et al. | 437/192 |
| 5,367,764 | 11/1994 | DiStefano et al. | 29/830 |
| 5,377,124 | 12/1994 | Mohsen | 364/489 |
| 5,397,921 | 3/1995 | Karnezos | 257/779 |
| 5,404,637 | 4/1995 | Kawakami | 29/843 |
| 5,409,865 | 4/1995 | Karnezos | 437/210 |
| 5,410,806 | 5/1995 | Schneider | 29/840 |
| 5,420,456 | 5/1995 | Galbi et al. | 257/529 |
| 5,420,460 | 5/1995 | Massingill | 257/693 |
| 5,435,480 | 7/1995 | Hart et al. | 228/180.1 |
| 5,436,412 | 7/1995 | Ahmad et al. | 174/265 |
| 5,438,166 | 8/1995 | Carey et al. | 174/261 |
| 5,464,790 | 11/1995 | Hawley | 438/600 |
| 5,468,995 | 11/1995 | Higgins, III | 257/697 |
| 5,481,795 | 1/1996 | Hatakeyama et al. | 29/852 |
| 5,487,218 | 1/1996 | Bhatt et al. | 29/852 |
| 5,502,889 | 4/1996 | Casson et al. | 29/830 |
| 5,537,108 | 7/1996 | Nathan et al. | 340/825.84 |
| 5,572,409 | 11/1996 | Nathan et al. | 361/806 |
| 5,574,311 | 11/1996 | Matsuda | 257/697 |
| 5,583,376 | 12/1996 | Sickler | 257/702 |
| 5,583,378 | 12/1996 | Marrs et al. | 257/710 |
| 5,612,574 | 3/1997 | Summerfelt et al. | 257/783 |

OTHER PUBLICATIONS

S. Chiang, et al., "Antifuse Structure Comparison for Field Programmable Gate Arrays", IEDM, Dec. 1992, pp. 611–614.

K. Gordon, et al., "Conducting Filament of the Programmed Metal Electrode Amorphous Silicon Antifuse", IEDM, Dec. 1993, pp. 27–30.

C. Hu, "Interconnect Devices for Field Programmable Gate Array", IEDM, Dec. 1992, pp. 591–594.

"Matsushita Team Eliminates Holes in High–Density PCB", Kenji Tsuda, Nikkei Electronics Asia, Mar. 1995, pp. 69–70.

"A Large Format Modified TEA $CO_2$ Laser Based Process For Cost Effective Small Via Generation", J.M. Morrison, etc., MCM '94 Proceedings, pp. 369–377, 1994.

"The Application of Laser Process Technology to Thin Film Packaging", T.F. Redmond, etc., IEEE, 1992, pp. 1066–1071.

"A New Circuit Substrate For MCM–L", Ysuke Wada, etc., ICEMCM '95, pp. 59–64, 1995.

"High–Performance Scalable Switch Design", Joshua Silver, ASIC & EDA, Jun. 1994, pp. 38–48.

"Dielectric Based Antifuse for Logic and Memory ICs", Esmat Hamdy, IEEE, 1988, pp. 786–789.

"Advanced Single Poly BiCMOS Technology For High Performance Programmable TTL/ECL Applications", Ali Iranmanesh, IEEE 1990 Bipolar Circuits and Technology Meeting, 4 pages.

"Conducting Filament of the Programmed Metal Electrode Amorphous Silicon Antifuse", Kathryn E. Gordon, etc., IEEE, 1993, pp. 27–30.

"Interconnect Devices for Field Programmable Gate Array", Chenming Hu, IEEE, 1992, pp. 591–594.

"Antifuse Structure Comparison for Field Programmable Gate Arrays", Steve Chiang, etc., IEEE, 1992, pp. 611–614.

"Interplay of Energies in Circuit Breaker and Fuse Combinations", Bernie DiMarco, etc., IEEE, 1991, pp. 1765–1769.

"Laser Personalizaation of NMOS Digital Topologies", James B. Gullette, etc., IEEE, 1983, pp. 1249–1252.

"I/O buffering System to a Programmable Switching Apparatus", Wen–Jai Hsieh, Official Gazette, Jan. 25, 1994, one page.

"Characterizing Quuickturn ASICs It's Done With Mirrors", Ron Iscoff, Semiconductor Intermational, Aug., 1990, pp. 68–73.

"An Ultra High Speed ECL Programmable Logic Device", Fred Ki, etc., IEEE 1990 Bipolar Circuits and Technology Meeting, 5 pages.

"Distribution Fuses of Nearest Future", T. Lipski, IEE, 3rd International Conference on Future Trends in Distribution Switch Gear, Jul. 26, 1990, pp. 41–45.

"A Novel MOS PROM Using a Highly Resistive Poly–Si Resistor", Masafumi Tanimoto, etc., IEEE, 1980, 4 pgs.

"CMOS Resistive Fuses For Image Smoothing and Segmentation", Paul C. Yu, etc., Journal of Solid–State Circuits, vol. 27, No. 4, Apr. 1992, pp. 545–553.

Letter to Hugo Goris from J. Rapaille, Philips Components, dated Jun. 7, 1994, 2 pages.

MULTILAYER BOARD HAVING INSULATING ISOLATION RINGS

CROSS REFERENCE TO RELATED APPLICATIONS

This application is related to U.S. patent applications Ser. No. 08/194,110, filed Feb. 8, 1994, Ser. No. 08/320,145, filed Oct. 7, 1994, Ser. No. 08/374,941, filed Jan. 18, 1995, Ser. No. 08/538,886, filed Oct. 4, 1995, Ser. No. 08/543,982, filed Oct. 17, 1995, and Ser. No. 08/374,941 filed Jan. 18, 1995, all of which are incorporated herein in their entirety.

1. Field og the Invention

This invention relates to a method for eliminating a drilling step and optionally a plating step used in fabrication of a substrate for supporting one or more electronic components such as integrated circuit die, and to the substrate resulting therefrom. In particular, this invention relates to a ball grid array structure having a support layer formed of a conductive material, the support layer having holes with isolated conductive islands located in the holes.

2. Background of the Invention

Figure 1A:
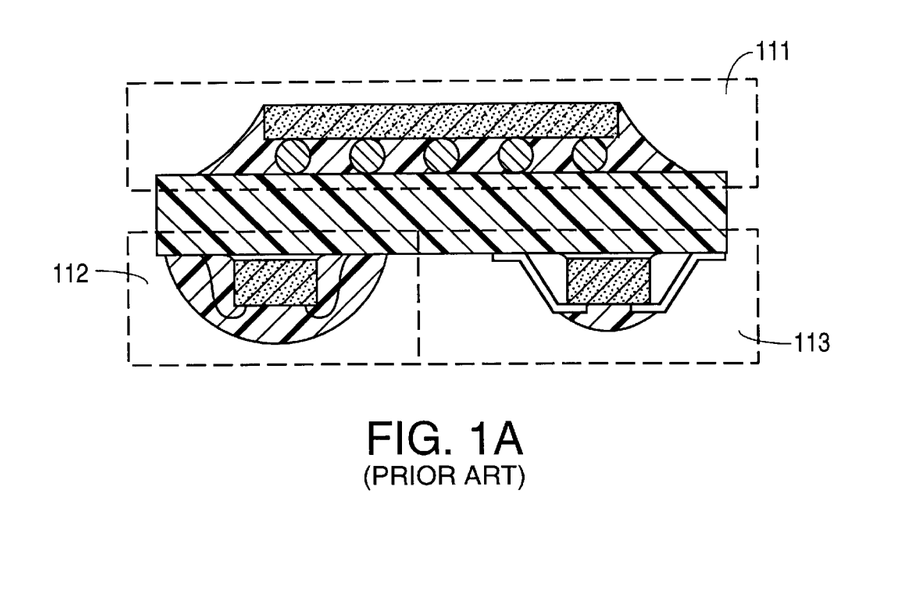
FIG. 1A illustrates, in cross-sectional views, three different conventional structures for mounting an integrated circuit chip on a ball grid array substrate.

A semiconductor die (also called an "integrated circuit" chip or IC chip), with electrical circuitry formed therein can be mounted on a "ball grid array" (BGA) substrate using, for example, flip chip (also called "controlled collapse chip connection") structure 111 (FIG. 1A), wire bond structure 112 or tape automated bond (TAB) structure 113 described in "Ball Grid Array Technology", edited by John H. Lau, McGraw-Hill, 1995 that is incorporated by reference herein in its entirety. See also U.S. Pat. Nos. 5,420,460, 5,409,865, 5,397,921, 4,940,181 and 5,216,278.

Figure 1B:
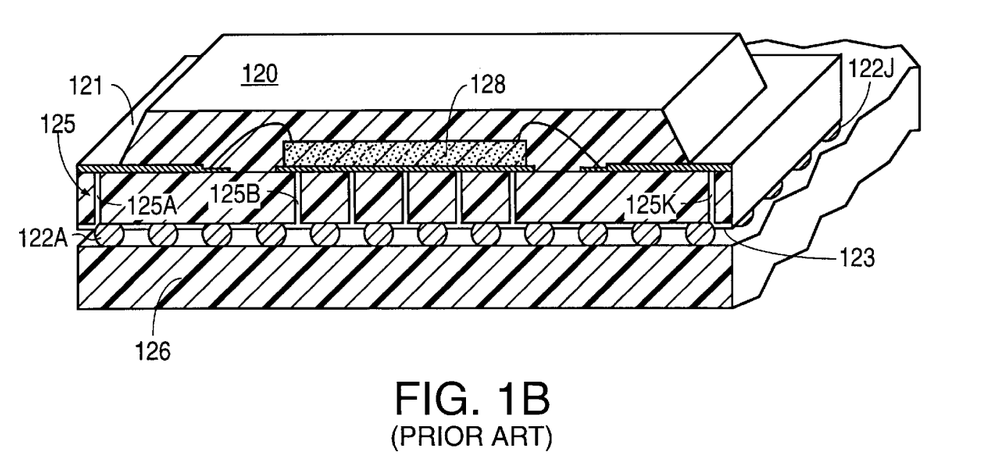
FIG. 1B illustrates, in a perspective view, a conventional ball grid array package mounted on a printed circuit board.

FIG. 1B discloses a BGA package 120 with an IC chip 128 mounted on BGA substrate 125's first side 121 using wire bond structure 112 (FIG. 1A), and an array (also called "area array") of solder balls 122A–122J (where J is the number of balls) attached to BGA substrate 125's second side 123. BGA substrate 125 has a number of plated vias 125A–125K (where K is the number of vias) that electrically couple IC chip 128 to solder balls 122A–122J. BGA package 120 is typically assembled independent of, and then mounted on a structure, such as a printed circuit board 126.

Lau states at page 38 of his book referenced above "[a]s the PCB technologies push themselves to smaller plated vias, better tolerances, and finer lines and spaces, this next-generation BGA can result in carriers that can theoretically be the same size as the chip in the horizontal dimensions."

Although theoretically possible, many practical difficulties preclude manufacture of such chip sized carriers or packages. For example, the diameter of a plated via in an IC package limits the number of vias that can be formed in a given area, which in turn limits the smallest possible size of an IC package.

Moreover, the cost of fabricating the smallest possible IC package using conventional processes is very high, as compared to the cost of making a larger IC package. Such conventional processes include use of a glass-fiber embedded polymer (such as bismaleimide-triazine ("BT") from Mitsubishi Gas Chemical Corp. Japan) as a core layer. The core layer typically has a thickness of 2 milli-inches to 30 milli-inches. Such a core layer provides structural support to an IC package typically built around the core layer.

Use of such a core layer requires the associated steps of drilling via holes, and plating the drilled via holes. Such drilling and plating steps typically account for the majority of the cost of forming a BGA package or a printed circuit board using conventional processes and materials.

SUMMARY

In accordance with this invention, a structure for supporting one or more electronic components is formed of multiple layers, including a support layer formed of a conductive material, such as a sheet of copper, that is thicker than any other layer in the structure to thereby provide structural support to all other layers in the structure. In one embodiment the support layer is formed from the sheet of conductive material by etching to remove conductive material from predetermined annular regions to thereby simultaneously form islands and one or more portions having annular gaps, hereinafter "isolation gaps," surrounding the islands. The isolation gaps are filled with a dielectric material to form isolation rings that are located between the support layer portions and the islands.

A support layer as described above provides structural support for e.g. a ball grid array package built around the support layer. Conductive islands in the support layer allow circuitry formed on one side of the support layer to be electrically connected to circuitry formed on the other side of the support layer. Such a support layer therefore eliminates the need for a conventional core layer of BT material.

Use of a support layer with conductive islands as described above also eliminates the prior art need for drilling and plating holes to form vias in the support layer. Etching a conductive sheet as described above is cheaper, faster and simpler than conventional drilling. Moreover, etching provides better yield and allows formation of a smaller dimension conductive element than possible by drilling. Furthermore, portions of a support layer can be used as a ground plane or as a power plane, thereby eliminating the need for such additional layers in the structure. A portion of the support layer can also be used as a heat sink for absorbing heat generated by, for example, an integrated circuit die attached to a side of the support layer.

A multilayered structure in accordance with this invention also includes two compound layers formed on two sides of the support layer. Each compound layer includes a layer of dielectric material (hereinafter "dielectric layer") with a number of via holes. Each via hole is formed adjacent to a conductive island such that a conductive element located in the via hole is electrically coupled to the conductive island. The structure also includes two layers of conductive material (hereinafter "conductive layers") formed on the two respective compound layers such that a trace of a first conductive layer is coupled to a trace of a second conductive layer through two conductive elements in the respective two compound layers and an island in the support layer.

A multilayered structure in accordance with this invention can be formed by a number of processes described below, either alone or by some combination thereof. In one embodiment, a support layer is formed from a sheet of copper on which is screen printed (or spray coated) a layer of photoimageable dielectric material, followed by imaging and developing the dielectric material to form via holes. The via holes are filled with a conductive paste (e.g. 50% by volume of conductive particles dispersed in 50% by volume of binding material) using a stencil printer. Then a conductive layer is formed on the compound layer, for example by lamination. Next, a number of isolation gaps and islands are simultaneously formed in the support layer by etching. In an optional step, isolation rings can be placed in each isolation gap, for example by screen printing a dielectric material, or by dispensing with a syringe. Then, a dielectric layer is formed on the support layer, followed by formation of via holes and filling the via holes, thereby to form a second compound layer. If the optional step is not used the isolation gaps are filled during formation of the dielectric layer. Next, a second conductive layer is formed on the second compound layer. Then, the two conductive layers are printed and etched to form traces on the two sides. Therefore, a trace on one side of the multilayered structure is electrically coupled to a trace on the other side of the structure through a conductive element, and island and another conductive element.

If during filling of the isolation gaps in the optional step, a portion of the dielectric material protrudes outside of the support layer, the protruding portion can be removed by an optional polishing step, to form a substantially flat surface necessary for further processing.

In other variations of the process described above, conductive elements in the via holes and traces can be formed by plating. For example, in one variation, the via holes and the conductive layers are plated simultaneously, followed by printing and etching of the conductive layers to define traces. In another variation, via holes and predetermined regions of the compound layer are plated to form the conductive elements and traces in the predetermined regions. This second variation eliminates the need for the printing and etching steps used in the first variation.

In another embodiment of the invention, the compound layers are formed simultaneously on two sides of a conductive sheet followed by simultaneous formation of the conductive layers on the two compound layers. The isolation gaps and the conductive islands in the conductive sheet are formed towards the end of the entire process, i.e. after formation of the compound and conductive layers. In this embodiment, at least one of the dielectric layers has a number of annular gaps (hereinafter "access gaps") adjacent to locations of to-be-formed isolation gaps in the support layer. Then via holes in the dielectric layers are filled with a conductive paste (as described above).

Next, two conductive layers are formed on the respective two dielectric layers, for example, by lamination. Then, traces are defined in the two conductive layers. During a trace definition step, the conductive layers' annular areas that cover access gaps in the dielectric layers are also etched to ensure access by an etching solution to the support layer. Then the support layer is etched to form the isolation gaps. Alternatively, as noted above, conductive elements in the via holes and conductive traces can be formed by plating.

As compared to sequential formation, simultaneous formation of compound layers and conductive layers results in a substantially flat structure which reduces the problem of warpage of the structure. Moreover, simultaneous lamination eliminates an additional lamination step otherwise required by a sequential process, and thereby reduces cost. Furthermore, as compared to a sequential process, simultaneous formation steps described above reduce the processing time required to form a structure, thereby increasing throughput and further reducing cost. Finally, simultaneous formation results in a symmetric thermal history on the two sides of a structure, thereby reducing the possibility of delamination due to warpage during operation of the structure.

In yet another embodiment of the invention, a removable substrate, such as a sheet of nickel, is used to form a support layer. Specifically, a dielectric material is screen printed or spray coated on the removable substrate at locations of to-be-formed isolation gaps, to form dielectric isolation rings.

Alternatively, a photoimageable dielectric material can be applied on the removable substrate at locations of to-be-formed isolation gaps by imaging and developing. Then a conductive material is plated on the removable substrate at all regions free of the dielectric material to thereby form a support layer that includes the dielectric rings and the plated material.

Adhesion between the plated material and the isolation rings can be improved by either a curing step after the support layer is formed, or by an adhesion improving step (for example by increasing roughness) before the plating step. Then the removable substrate is removed, e.g. peeled off from the support layer. The support layer is processed by one or more steps described above, for example, by sandwiching between two compound layers followed by formation of two conductive layers. Use of a photoimageable process to form an isolation ring allows the isolation ring to be made substantially smaller than possible in some other embodiments. Moreover, the process of this embodiment eliminates the step of placing the isolation ring into the isolation gaps, and therefore reduces cost, although a plating step is required.

In still another embodiment of the invention, a sheet of conductive material is etched at predetermined locations to form a support layer having a number of through holes. Then a dielectric material is applied, for example by a spray coater, on both sides of the support layer as well as inside the through holes to form dielectric layers on the support layer and reel shaped dielectric elements around the through holes respectively. Thereafter, a number of conductive elements are formed in holes in the dielectric elements, for example by filling with a conductive paste. In this step, conductive paste is also filled in via holes in the dielectric layers. The dielectric elements insulate the conductive elements from the support layer.

DETAILED DESCRIPTION

In accordance with this invention, a multilayered structure for supporting one or more electronic components includes a support layer formed of a conductive material, such as a sheet of copper, that is thicker than any other layer in the structure. The support layer has a number of conductive islands separated from other portions of the support layer by isolation gaps that are annular in shape. A ring of dielectric material (also called "isolation ring") is located in each of the isolation gaps. Other layers of the multilayered structure are formed around and supported by the support layer.

Figure 2A:
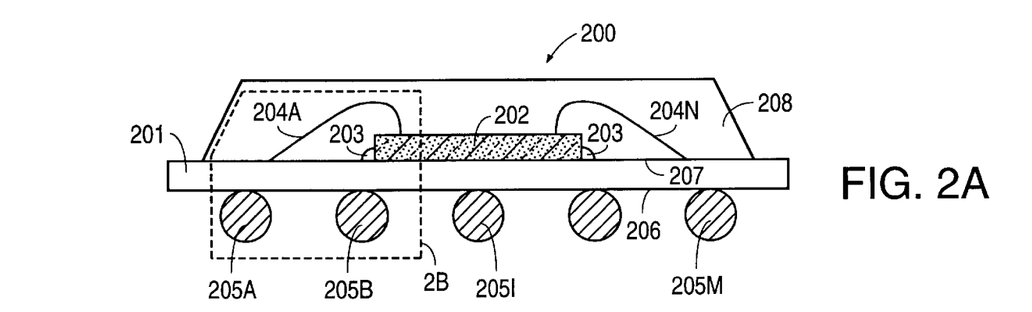
FIG. 2A illustrates, in a cross-sectional view, a ball grid array package including a multilayered structure for supporting a die in accordance with the invention.
Figure 2B:
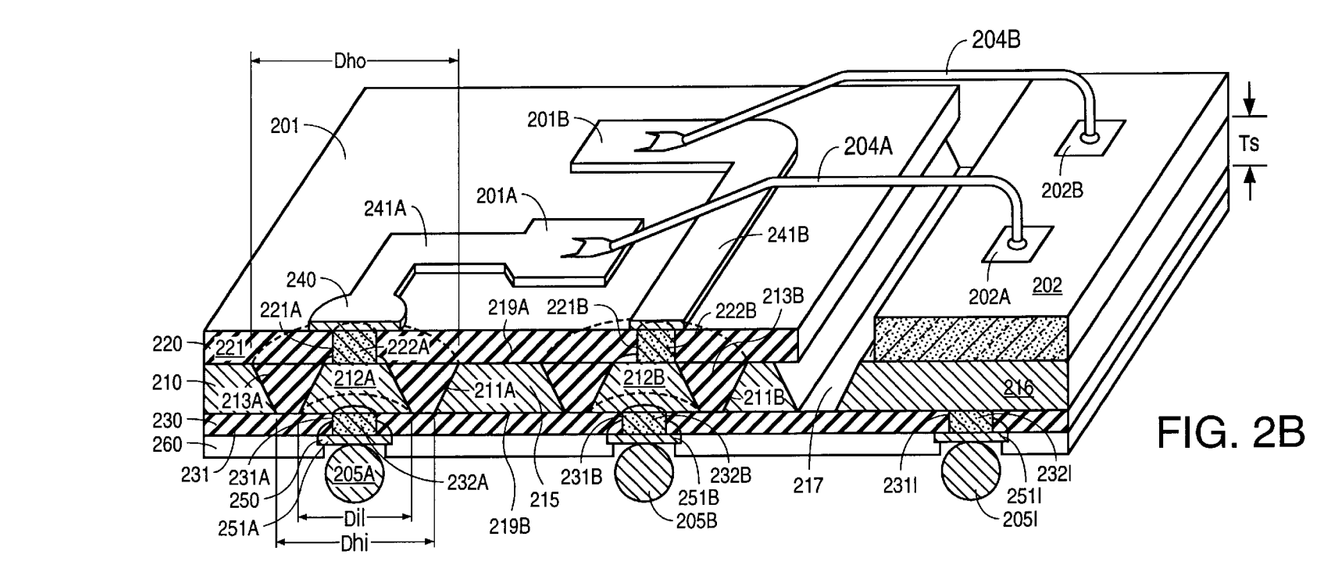
FIG. 2B illustrates, in an enlarged cut-away perspective view a portion of the structure of FIG. 2A in box 2B.

In one specific embodiment, an integrated circuit package 200 (FIG. 2A) includes a structure 201 on which is mounted an integrated circuit die (also called "IC die") 202. Specifically, IC die 202 is attached to structure 201 by a die attach adhesive 203, and a number of bond wires 204A–204N (where N is the number of bond wires) electrically couple pads 202A–202N (FIG. 2B) to contacts 201A–201N of structure 201. For clarity, not all parts, e.g. pads 202A–202N, bond wires 204A–204N and contacts 201A–201N are shown in FIGS. 2A–2B.

Structure 201 also includes a number of conductive balls (also called "substrate balls") 205A–205M (where M is the number of substrate balls, and in one variation M=N) formed on a side 206 that is opposite to the side 207 on which is mounted IC die 202. IC package 200 also includes an encapsulant 208 formed on side 207 of structure 201, to thereby enclose IC die 202, bond wires 204A–204N and contacts 201A–201N.

Structure 201 is a multilayered structure that includes support layer 210 formed of a conductive material, such as a sheet of copper. Support layer 210 is sandwiched between dielectric layers 220 and 230 which in turn are sandwiched between conductive layers 240 and 250. Support layer 210 has a number of annular isolation gaps 211A, 211B . . . and a corresponding number of conductive islands 212A, 212B . . . surrounded by isolation gaps 211A–P, 21B . . . Conductive islands 212A, 212B . . . have a dimension Die (e.g. larger diameter of a conical frustrum) smaller than the smallest diameter Dhi of the wall of portion 215 of support layer 210 such that isolation rings 213A, 213B . . . are formed between islands 212A, 212B . . . and portion 215 when a dielectric material is placed in isolation gaps 211A, 211B . . .

In this particular variation of the embodiment, support layer 210 also includes another portion 216 on which is mounted IC die 202, and portion 216 is coupled to a source (not shown) of ground reference voltage, to thereby allow portion 216 to function as a ground reference plane. Moreover, portion 216 functions as a heat sink to absorb the heat generated by IC die 202. Portion 216 passes the heat to conductive elements, e.g. element 232I, that then pass the heat to the substrate balls, e.g. ball 205I. Also in this particular variation, portions 215 and 216 of support layer 210 are separated from each other by a channel 217, thereby to allow portion 215 to be used as, for example, a power reference plane.

As noted above, support layer 210 is sandwiched between compound layers 220 and 230 that are formed on the two sides 219A and 219B respectively of support layer 210. Each of compound layers 220 and 230 includes respectively dielectric layers 221 and 231 in which are formed a number of via holes 221A, 221B . . . and via holes 231A, 231B . . . 231I. Compound layers 220 and 230 also include a number of conductive elements 222A, 222B . . . and 232A, 232B . . . 232I located in the respective via holes 221A, 2219 . . . and 231A, 231B . . . 231I.

Structure 201 also includes conductive layers 240 and 250 that are formed on compound layers 220 and 230 and etched to form contacts 201A, 201B . . . and 251A–251I respectively. Contacts 201A, 201B . . . are suitable for coupling to pads 202A, 202B of IC die 202, while contacts 251A–251I are suitable for coupling to substrate balls 205A–205I. During etching of conductive layers 240 and 250, traces, e.g. traces 241A, 241B, are also formed on compound layers 220 and 230. Structure 201 also includes protective layers formed of, for example, a solder mask material, such as layer 260 on portions of conductive layer 250 and compound layer 230, to thereby protect structure 201.

Each of isolation gaps 211A, 211B . . . has a height equal to thickness Ts of support layer 210, thereby to physically isolate each of islands 212A–212N from portion 215 of layer 210. In this particular embodiment, each isolation gap has an inner diameter Dhi of, e.g. 14 milli-inches, that is smaller than an outer diameter Dho of e.g. 16 milli-inches. Moreover, in this particular variation of the embodiment, during the etching step, an optional channel 217 of a height equal to sheet thickness Ts is also formed, thereby to isolate portion 215 from another portion 216 of layer 210.

In one embodiment (FIG. 2B) support layer 210 is thicker than any other layer in multilayered structure 201 and thereby provides structural support to all other layers built around support layer 210. For example, support layer 210 has a thickness Ts=5 milli-inches, while all other layers 220, 230 and 260 have a thickness around 2 milli-inches. Use of etching as described below to form support layer 210 eliminates the need for drilling holes and the associated costs and time needed to form a prior art IC package using a BT core layer.

Structure 201 described above in reference to FIGS. 2A–2B can be formed by a number of processes. For example, in one specific embodiment, a support layer is formed from a sheet 311 of conductive material, e.g. copper. Sheet 311 has a thickness Ts in the range of, for example, 3–20 milli-inches, preferably 5 milli-inches. Sheet 311 can be of a large size sufficient to form a large number of IC package substrates simultaneously, which ball grid array substrates are obtained by dividing, e.g. by etching or routing at the end of the process (prior to mounting IC die). For example, a sheet 311 of area 18 inches by 24 inches can be processed as described below in reference to FIGS. 3A–3H, and then routed into 150 substrates, each of an appropriate area, e.g. 1.3 inches by 1.3 inches, prior to mounting of IC die to form the package illustrated in FIG. 3I. Many of the reference numerals in FIGS. 3A–3I, 4A–4D, 5A–5D, 6A–6D, 7A–7D and 8A–8B are derived by adding 100, 200, . . . 600 to reference numerals in FIGS. 2A–2B that identify similar features.

Figure 3A:
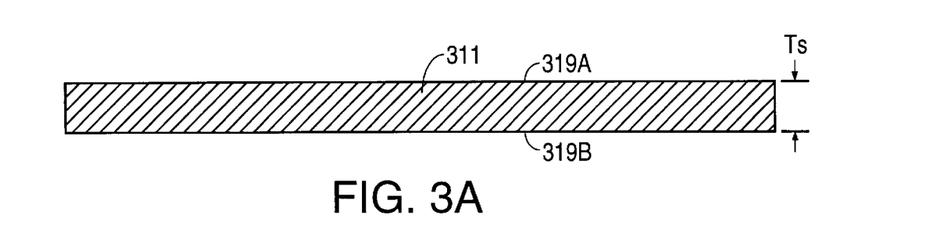
FIGS. 3A–3I illustrate, in cross-sectional views, a process for forming a structure in one embodiment of the invention.
Figure 3B:
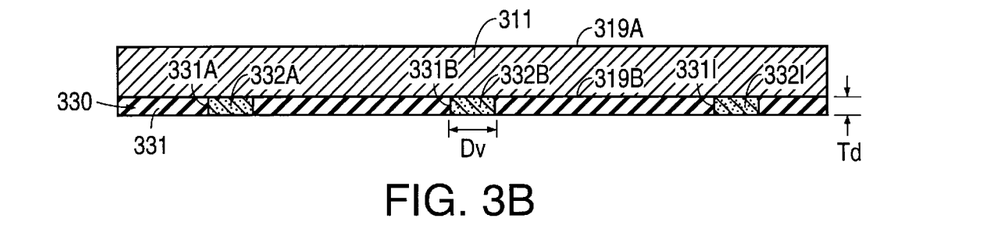
Figure 3C:
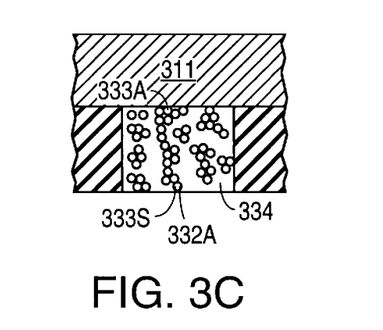
Figure 3D:
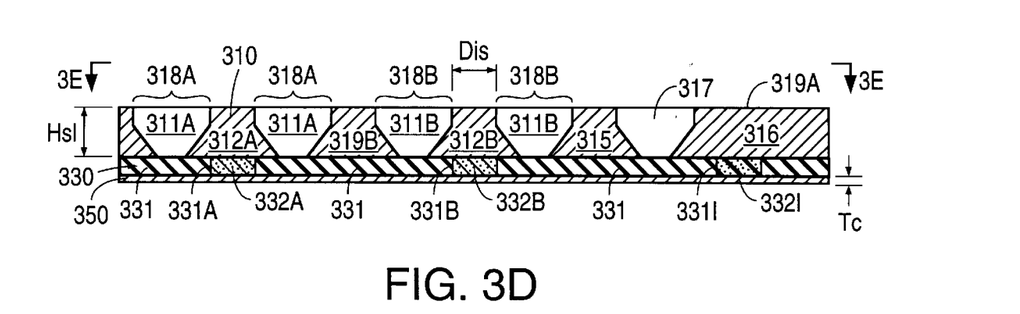
Figure 3E:
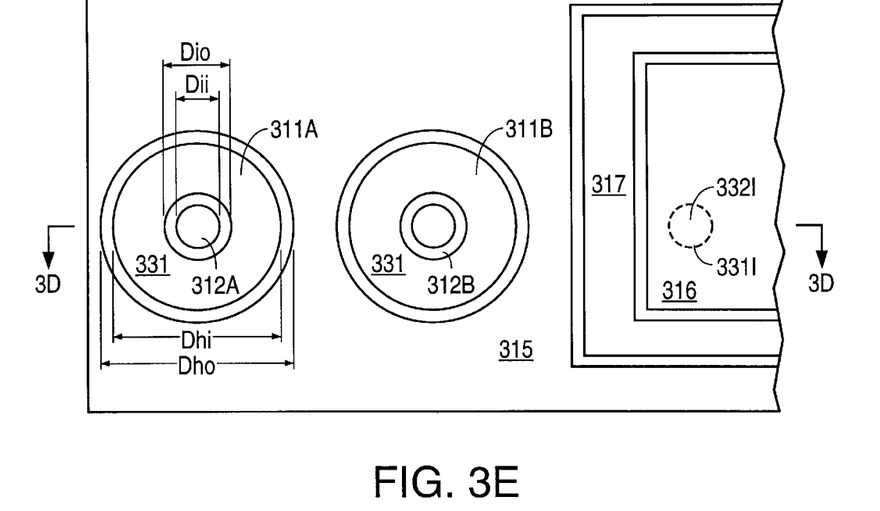
Figure 3F:
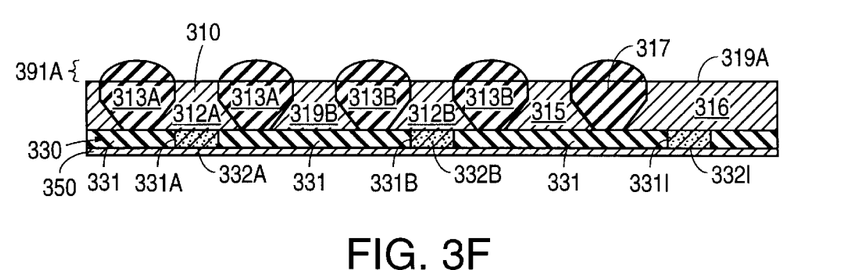

In this embodiment, a compound layer 330 is formed on a side 319B of sheet 311 (FIG. 3A) followed by formation of a conductive layer 350 on compound layer 330 (FIG. 3B). Specifically, an adhesive layer (such as an oxide layer not shown) can be formed on side 319B of conductive sheet 311 followed by formation of a layer 331 of dielectric material for example by screen printing. In addition to or instead of an adhesive layer, a rough surface can be formed by e.g. etching or grinding, to improve adhesion of the applied dielectric material. The dielectric material used to form dielectric layer 331 in two alternative variations of this embodiment is nonphotoimageable or photoimageable. If a nonphotoimageable dielectric material is used to form dielectric layer 331, a number of via holes, e.g. via holes 331A–331M, are formed in dielectric layer 331 during the screen printing step. Alternatively, if a photoimageable dielectric material is used, the photo-imageable dielectric material can be screen printed or spray coated followed by imaging and developing the dielectric material to form via holes 331A–331M.

Next, conductive elements 332A–332M can be formed by filling via holes 331A–331M with a material, such as a conductive paste of the type described briefly below and in detail in U.S. patent application Ser. No. 08/538,886, filed Oct. 4, 1995, that was incorporated by reference above. A conductive paste contains a binding material that is heavily loaded with conductive particles, for example, particles 333A–333S (FIG. 3C) in binding material 334 such that each of particles 333A–333S is in physical contact with one or more of particles 333A–333S so as to form a conductive element 332A through binding material 334.

Thereafter, a conductive layer 350 (FIG. 3D) is formed on compound layer 330, for example by lamination. Next, sheet 311 is etched to form a number of islands 312A, 312B . . . by printing and etching annular regions 313A, 313B . . . surrounding the to-be-formed islands 312A, 312B . . . thereby to form isolation gaps 311A, 311B . . . In this particular embodiment, islands 312A, 312B . . . each have a smaller diameter Dis (FIG. 3E) of, e.g. 4 milli-inches, and a larger diameter Dil of e.g. 6 milli-inches, due to isotropic etching.

Next, in an optional step, a dielectric material is filled in various isolation gaps, e.g. isolation gap 311A (FIG. 3F) to form an isolation ring 313A surrounding island 312A. If a portion 391A (FIG. 3F) of the dielectric material protrudes outside of side 319A, the protruding portion can be polished off in another optional step.

Figure 3G:
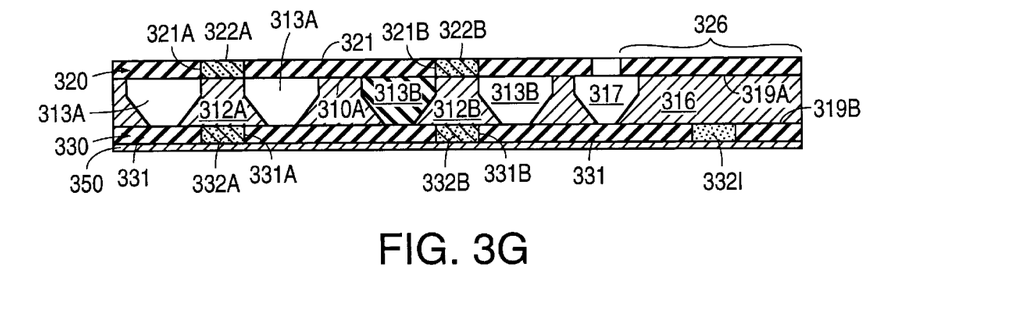
Figure 3H:
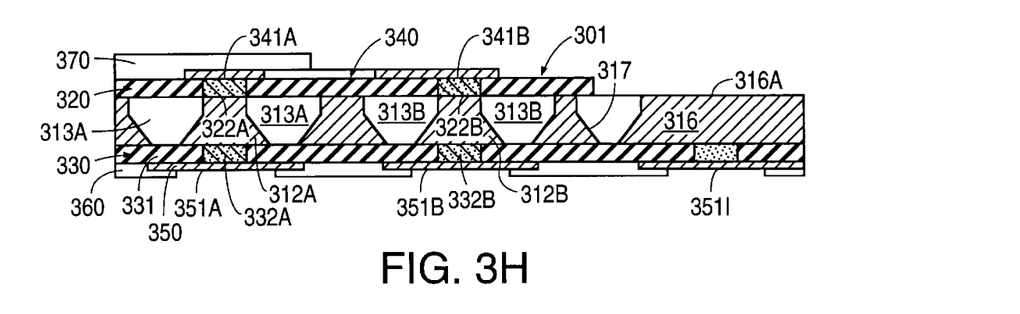

Then, compound layer 320 (FIG. 3G) is formed in a manner similar to that described above for compound layer 330. The dielectric material of dielectric layer 321 included in compound layer 320 is removed from a region 326 over portion 316, thereby to expose a surface 316A of portion 316 (FIG. 3H). Moreover, a conductive layer 340 is formed. Conductive layers 340 and 350 are etched to form a group of traces 341A, 341B . . . and a second group of traces 351A, 351B . . . . Traces 341A, 341 . . . are coupled to the respective conductive elements 322A, 322B . . . . Similarly, conductive traces 351A–351I are coupled to conductive elements 332A–332I. Islands 312A, 312B . . . are in contact with conductive elements 322A, 322B . . . and 332A, 332B . . . Therefore, traces 341A, 341B. . . are coupled to traces 351A, 351B. Moreover, portions of support layer 310, such as portions 315 and 316 are in contact with certain of the conductive elements, e.g. portion 316 contacts conductive element 332I (FIG. 3G).

Figure 3I:
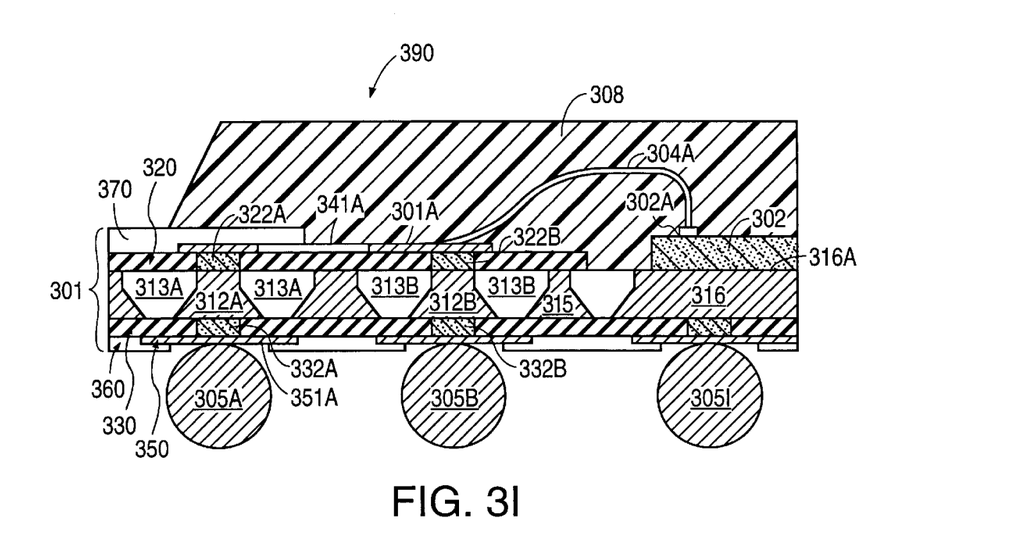

Then, a solder mask material is applied to form layers 360 and 370 (FIG. 3H) on dielectric layers 320 and 330 and conductive layers 340 and 350. A contact coating, e.g. of nickel and gold Ni/Au can be applied to copper contacts 301A–301N prior to formation of layers 360 and 370 if necessary. Finally, structure 310 is routed, scored, punched or etched, followed by attachment of an IC die, wire bonding, molding (with encapsulant 308) and attachment of solder balls to complete formation of an integrated circuit package 390 (FIG. 3I). As noted above, a portion 316 can be used as a reference plane for, for example, a ground reference voltage. Similarly, portion 315 can be used as a reference plane for, for example, a power reference voltage signal. Alternatively, portions 315 and 316 can be electrically coupled to each other to form a single reference plane.

Figure 3J:
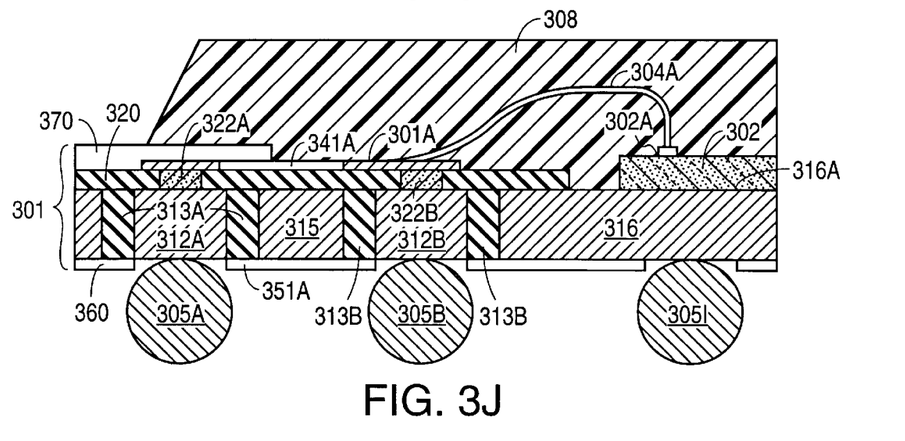
FIG. 3J illustrates a variation of the process illustrated in FIGS. 3A–3I.

Although in one variation of the embodiment, conductive layers 340 and 350 are formed by lamination, in another variation of the embodiment, conductive layers 340 and 350 are formed by plating. In the latter variation, instead of filling via holes 331A, 331B . . . with a conductive paste, the conductive material used in the plating step is also plated into via holes 331A, 331B . . . in a manner well known in the art, as described in U.S. Pat. No. 5,097,593. In a variation of the process described above in reference to FIGS. 3A–3H, a second compound layer 320 and a second conductive layer 340 (FIGS. 3G and 3H) are not formed. Instead, bond wires, e.g. wire 304A, are directly attached to conductive islands, e.g. island 312B, as illustrated in FIG. 3J, after application of a Ni/Au layer on island 312B. In this particular variation, islands are formed approximately as solid cylinders, e.g. by jet etching.

Although in one embodiment, layers 330, 350, 320 and 340 are formed sequentially as described above in reference to FIGS. 3A–3H, such layers can be formed simultaneously. In another embodiment of the invention, compound layers 420 and 430 (FIG. 4A) are formed simultaneously on the two sides 419A and 419B, respectively, of sheet 411. Specifically, dielectric layers 421 and 431 are formed on the respective sides 419A and 419B simultaneously, for example, by use of a photo-imageable dielectric material. Then, via holes 421A, 421B . . . and 431A, 431B . . . are formed in the respective dielectric layers 420 and 430, by imaging and developing. During the imaging and developing steps, a number of annular openings 471A, 471B . . . are formed in dielectric layer 430 at locations adjacent to the to-be-formed isolation gaps in sheet 411. Via holes 421A, 421B . . . and 431A, 431B . . . in respective dielectric layers 421 and 431 are filled with a conductive paste (described above) to form conductive elements 422A, 422B . . . and 432A, 432B . . . respectively.

Then, two conductive layers 440 and 450 (FIG. 4B) are formed on compound layers 420 and 430 respectively, for example, by lamination. Then, traces 441A, 441B . . . and 451A, 451B . . . are defined in conductive layers 440 and 450, for example, by etching. During this step, conductive layers 440 and 450 are also etched in annular areas 472A, 472.B . . . that cover annular openings 471A, 471B . . . , thereby to expose annular openings 471A, 471B . . . . . If thickness Ts (FIG. 4B) of sheet 411 is sufficiently small (for example, Ts=3 milli-inches which is larger than thickness Tc=2 milli-inches of conductive layers 440 and 450), isolation gaps 411A, 411B . . . (FIG. 4C) can be formed (e.g. by etching) during the trace definition step. If such a process is used, traces 441A, 441B . . . and 451A, 451B . . . are protected with a coating, e.g. Ni/Au or Sn or solder prior to etching to form isolation gaps 411A, 411B . . . .

Figure 4A:
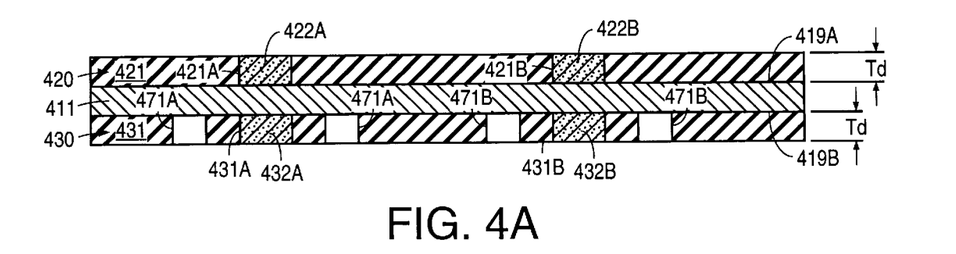
FIGS. 4A–4D illustrate, in cross-sectional views, another process for forming a structure in accordance with the invention.
Figure 4B:
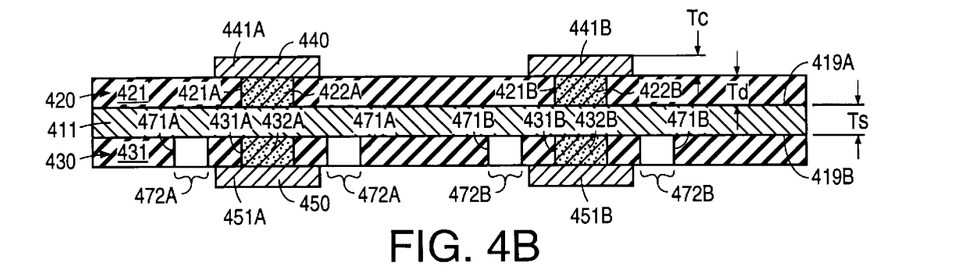
Figure 4C:
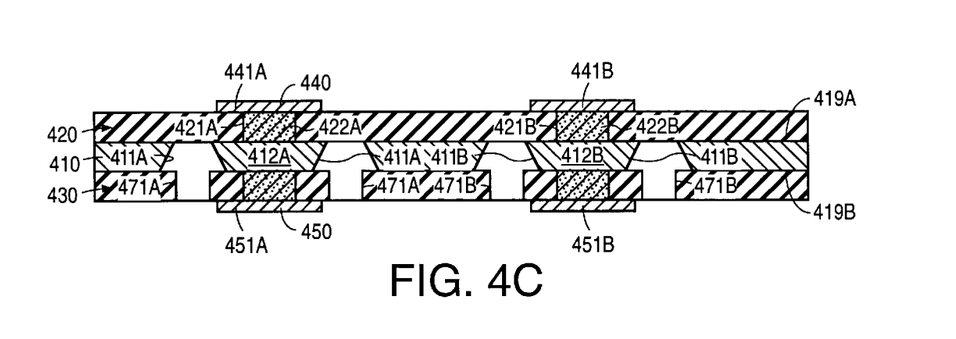

In the example described above, thickness Td of compound layers 421 and 431 is about 2 milli-inches, which is also smaller than thickness Ts of support layer 410.

Figure 4D:
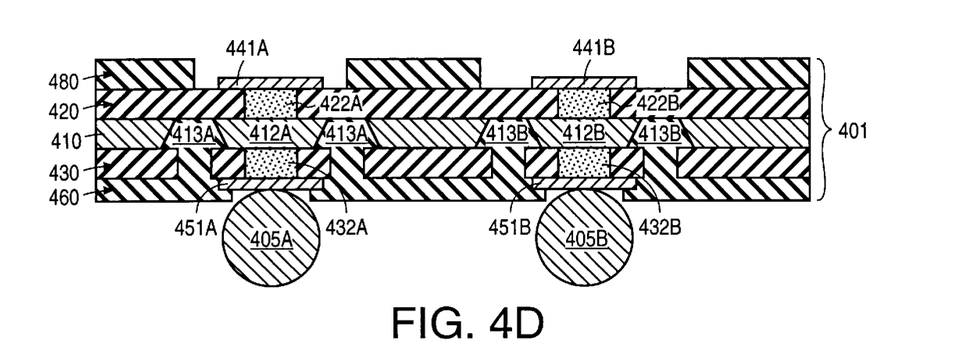

In another variation of the embodiment, conductive layers 440 and 450 are protected, for example, by application of a resist material (not shown) after formation of traces 441A, 441B . . . and 451A, 451B . . . , and then sheet 411 is etched through annular gaps 471A, 471B . . . to thereby form isolation gaps 411A, 411B . . . . Then, solder mask layers 460 and 480 are formed on a compound layer 420 and conductive layer 440 on one side and on compound layer 430 and conductive layer 450 on the other side, thereby to form structure 401 (FIG. 4D). Then, conductive balls 405A, 405B . . . (e.g. formed of solder) and a die (not shown) are attached to structure 401, followed by wire bonding (or flip chip die attach step) and encapsulation to complete formation of a ball grid array package.

Figure 5A:
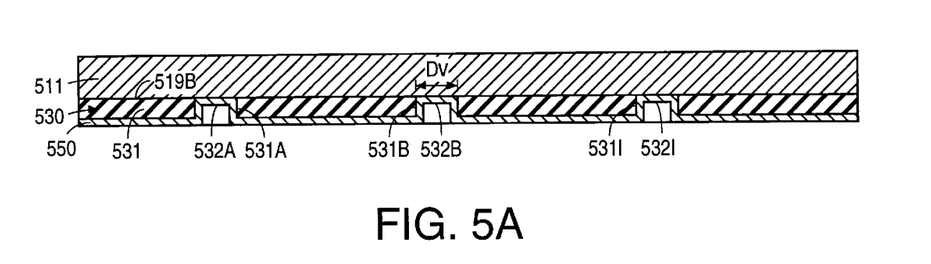
FIGS. 5A–5D illustrate, in cross-sectional views, yet another process for forming a structure in accordance with the invention.
Figure 5B:
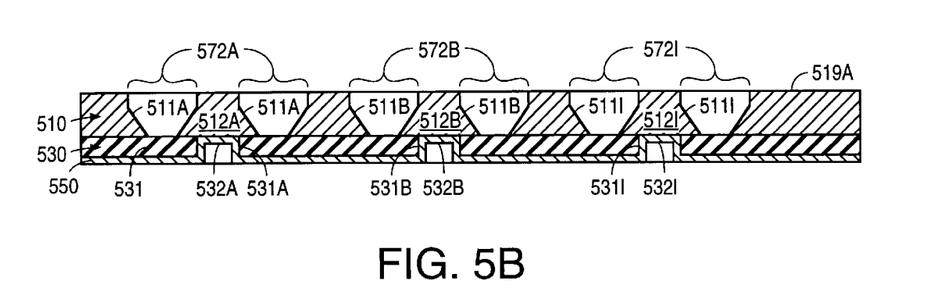
Figure 5C:
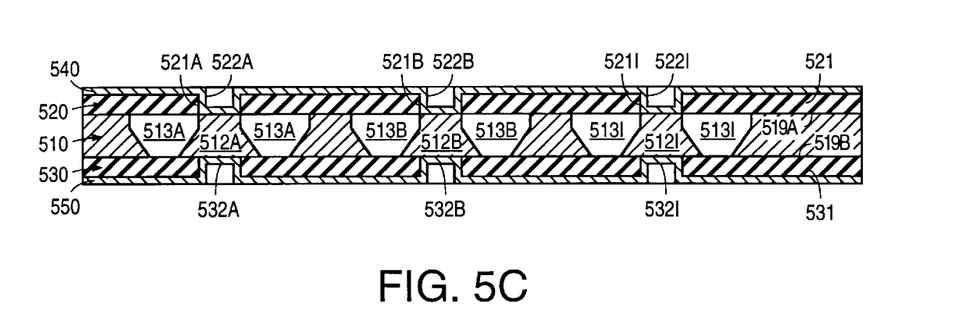
Figure 5D:
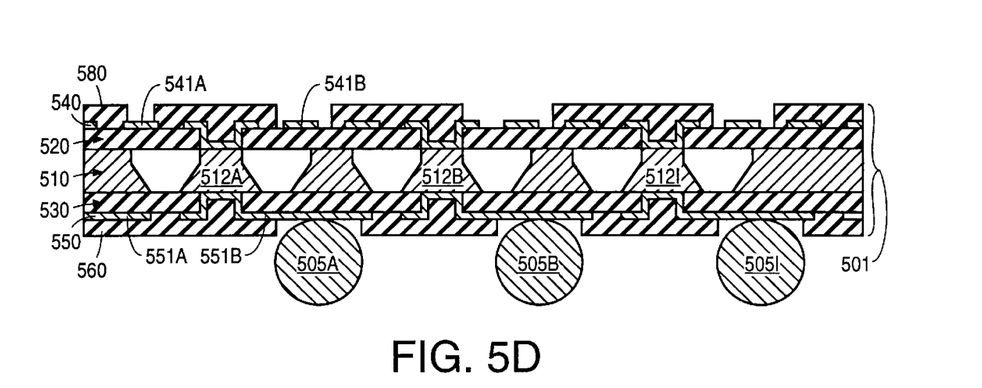

In another embodiment, instead of using microfilled via material as described above in reference to FIGS. 3A–3I and 4A–4D, conductive elements are formed by plating of via holes in a dielectric layer, as described below in reference to FIGS. 5A–5D. Specifically, a dielectric material is used to form a dielectric layer 531 on side 519A of sheet 511 (FIG. 5A). Dielectric layer 531 has a number of via holes 531A–531I, that are formed by imaging and developing a photo-imageable material used to form layer 531. Each of via holes 531A–531I has a diameter Dv of, for example, 6 milli-inches which is larger than twice the thickness Tc (e.g. 2 milli-inches) of a conductive layer 550 to be formed next. Next, conductive layer 550 is formed on dielectric layer 531, for example, by plating. During formation of conductive layer 550, via holes 531A–531I of dielectric layer 531 are plated such that a number of conductive elements 532A–532I are formed in via holes 531A–531I. Conductive elements 532A–532I are formed in contact with the side 519B of sheet 511.

Next, sheet 511 is etched on side 519A, in annular regions 572A–572I, thereby to form isolation gaps 511A–511I (FIG. 5B) surrounding islands 512A–512I, in a manner similar to that described above for FIG. 3D. Then, a dielectric layer 521 (FIG. 5C) is formed on side 519A on support layer 510. During formation of dielectric layer 521, isolation gaps 511A–511I can be filled to form isolation rings 513A–513I around respective conductive islands 512A–512I. A number of via holes 521A–521I are formed in dielectric layer 521, for example, by stencil printing, or alternatively by imaging and developing a photo-imageable dielectric material used to form layer 521. Then, a conductive layer 540 is formed on dielectric layer 521, such that via holes 521A–521I are plated, to form conductive elements 522A–522I. Although conductive elements 522A–522I and 532A–532I are illustrated in FIGS. 5A–5D as having a cup shape, such conductive elements can have other shapes (e.g. solid cylinder).

Then, conductive layers 540 and 550 are etched to form traces 541A, 541B . . . and 551A, 551B . . . . Thereafter, protective layers 560 and 580 are formed, for example, by applying a solder mask material to thereby complete formation of structure 501. After die attach, wire bonding and molding (not shown in FIGS. 5A–5D), solder balls 505A–505I are formed on the respective traces of structure 501, to complete formation of a ball grid array package.

Figure 6A:
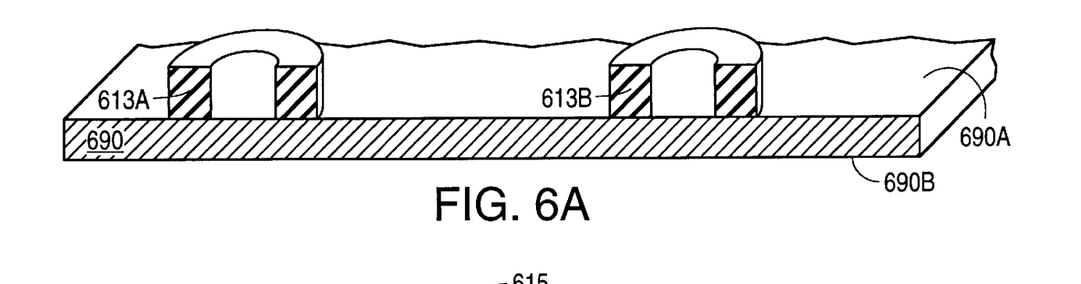
FIGS. 6A–6C illustrate, in cross-sectional views, still another process for forming a structure in accordance with the invention.
Figure 6B:
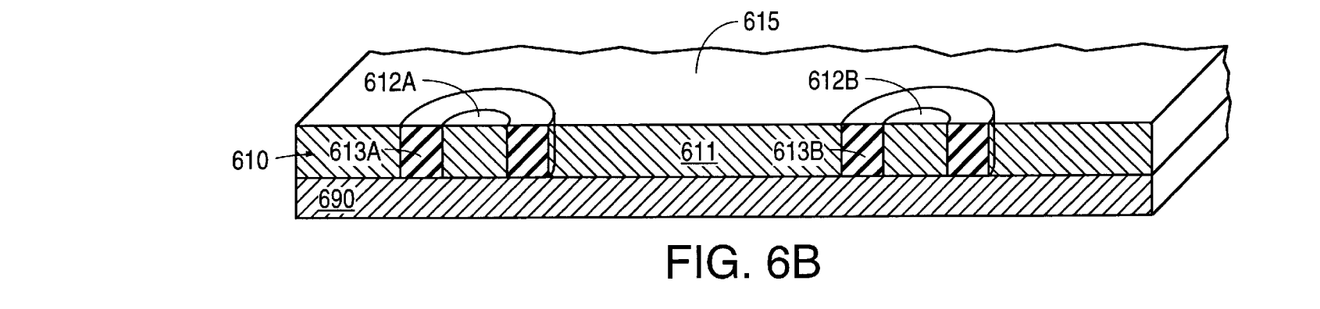
Figure 6C:
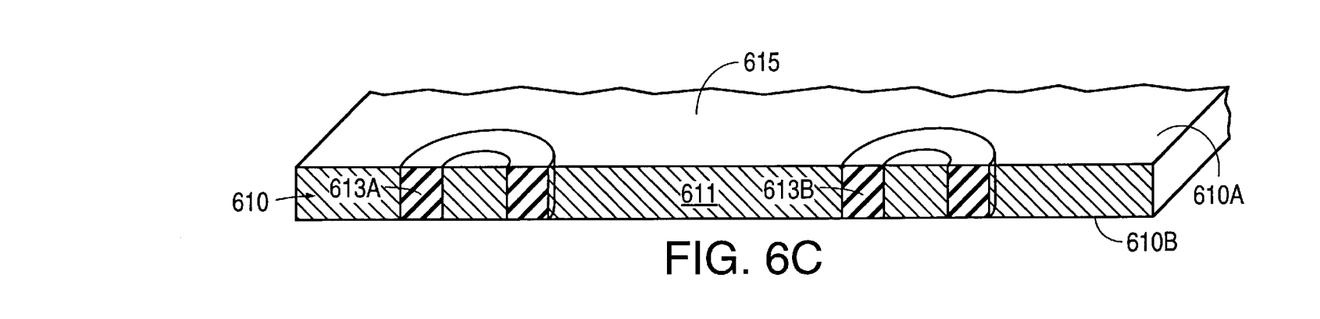

In another embodiment of the invention, a removable substrate 690 (FIG. 6A) such as a sheet of nickel is used to form a support layer of the invention. Specifically, a dielectric material is screen printed (or spray coated) on a first side 690A of removable substrate 690 at predetermined locations, thereby to form annular isolation rings, e.g. rings 613A, 613B . . . . Alternatively, a photo-imageable dielectric material can be applied all over removable substrate 690. After imaging and developing, dielectric material remains as isolation rings 613A, 613B . . . at the predetermined locations. Thereafter, a conductive material is plated on removable substrate 690 at all regions that are free of dielectric material, i.e. at all regions other than isolation rings 613A, 613B . . . (e.g. portion 615 and islands 612A, 612B), to thereby form support layer 610 (FIG. 6B). Thereafter, removable substrate 690 is removed, e.g. peeled off (FIG. 6C). Thereafter, two compound layers are formed on the two sides 610A and 610B, and a conductive layer is formed on each of the compound layers in a manner similar to the steps discussed above, for example in reference to FIGS. 3A–3D.

Adhesion between plated material 611 and isolation rings 613A, 613B . . . can be improved by either a curing step after support layer 610 is formed, or by an adhesion improving step, for example by increasing roughness of isolation rings 613A, 613B . . . before the plating step.

Figure 7A:
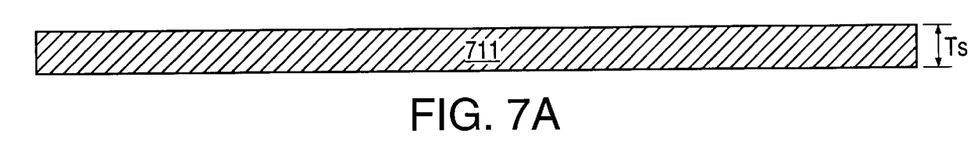
FIGS. 7A–7D illustrate, in cross-sectional views, still another process for forming a structure in accordance with the invention.
Figure 7B:
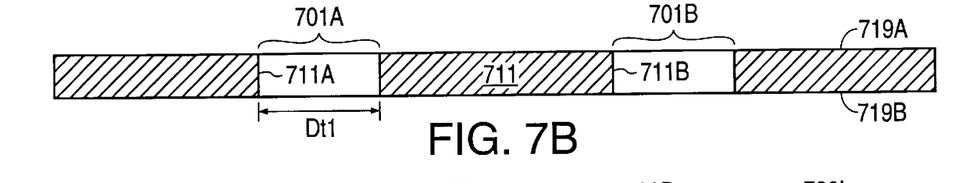
Figure 7C:
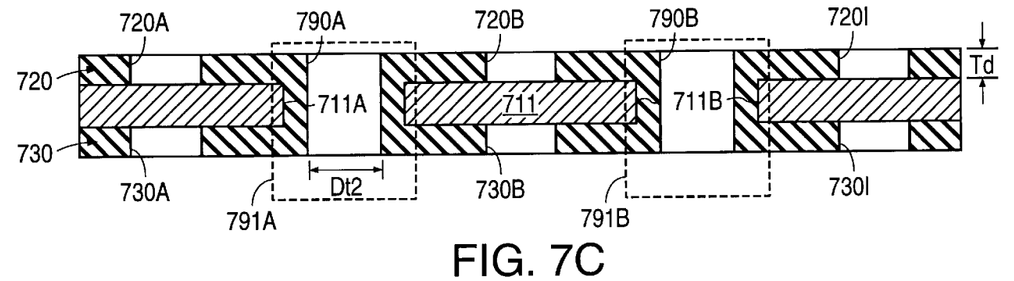

In yet another embodiment of the invention, a sheet 711 (FIG. 7A) of conductive material is etched at predetermined locations 701A and 701B to form through holes 711A and 711B (FIG. 7B). Through holes 711A and 711B each have a diameter Dt1 that is at least a multiple of thickness Ts of sheet 711. For example, in one variation of the embodiment, Dt1 is 8 mils, while Ts is 2 mils.

Then, a dielectric material is applied, for example by a spray coater, on the surfaces of holes 711A and 711B as well as on the sides 719A and 719B of sheet 711. Such application of dielectric material forms dielectric layers 720, 730 (FIG. 7C) and a number of reel shaped dielectric elements 791A, 791B . . . around holes 711A, 71B . . . . Each of dielectric layers 720 and 730 has a thickness Td that is smaller than diameter Dt1 such that even after application of the dielectric material, through holes 790A, 790B . . . remain in dielectric elements 791A, 791B . . . . Through holes 790A, 790B . . . have a diameter Dt2 of, for example, 4 milli-inches. Dielectric layers 720 and 730 also have a number of via holes 720A–720I and 730A–730I that are formed, for example by imaging and developing or, alternatively, during a screen printing step.

Figure 7D:
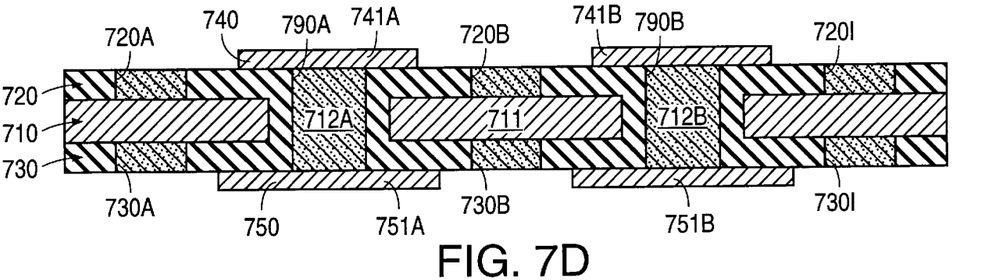
Figure 8A:
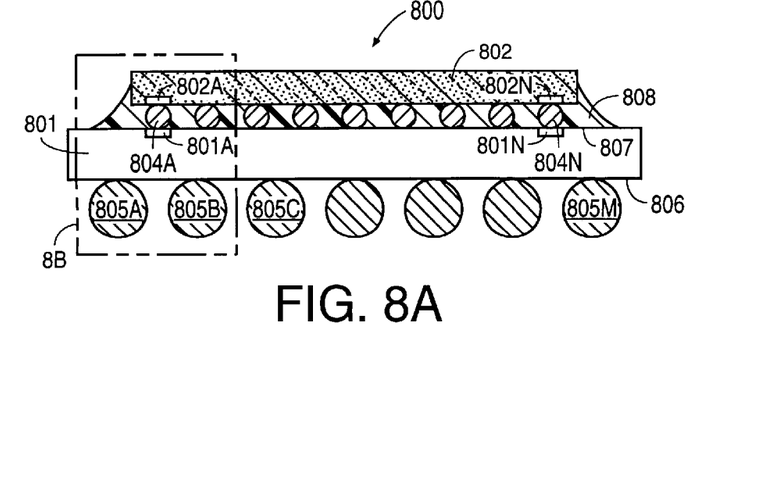
FIGS. 8A–8B illustrate in a cross-sectional view and an enlarged view, respectively, similar to FIGS. 2A–2B, a die attached by conductive balls to the multilayered structure.
Figure 8B:
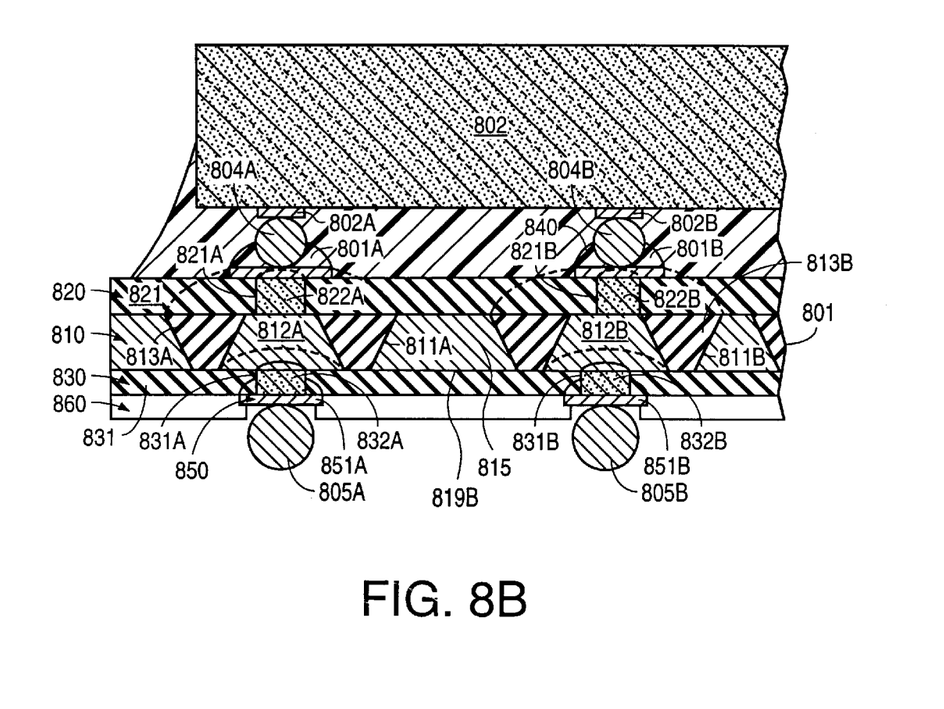

Thereafter, a number of conductive elements are formed in through holes 790A, 790B . . . , for example by filling with a conductive paste to form solid cylindrical conductive elements 712A, 712B . . . (FIG. 7D). Moreover, via holes 720A–720I and 730A–730I are also filled with the conductive paste to form e.g. thermal vias. Finally, conductive layers 740 and 750 are formed on the compound layers 720 and 730 followed by etching to form traces, e.g. traces 741A, 741B, 751A and 751B. In this particular embodiment, the conductive elements, e.g. elements 712A and 712B, are insulated from portions of sheet 711 by reel shaped dielectric elements 791A, 791B . . . .

Numerous modifications and adaptations of the embodiments described above would be obvious in view of the enclosed disclosure. For example, although formation of only two compound layers and only two conductive layers has been described above, any number of compound layers and conductive layers can be formed around a conductive support layer in accordance with the invention.

Although die 202 (FIG. 2A, 2B) is illustrated as being coupled to multilayered structure 201 by bond wires 204A–204N, in another embodiment, die 802 (FIGS. 8A, 8B) is attached to multilayer substrate 801 by a number of conductive balls (also called die attach balls) 804A, 804B . . . 804N. Specifically, a number of pads 802A–802N of die 802 are coupled by the respective die attach balls 804A–804N to contacts 801A–801N of multilayered structure 801. Multilayered structure 801 has a number of traces of the type similar to traces 241A and 241B (FIG. 2B) and also has other parts similar to those discussed above in reference to structure 201.

Moreover, although a structure of three conductive layers has been described above, two such structures can be laminated to each other to form a structure of six conductive layers. For example, in FIGS. 3G and 3H, after conductive layer 340 is formed and etched instead of a protective layer 370 being formed, a third compound layer (not shown) can be formed. Then two such structures can be laminated, with the third compound layers of the two structures facing each other, to form a single six layered structure.

Accordingly, various modifications and adaptations of the above described embodiments are encompassed in the appended claims.

We claim:

1. A structure for supporting one or more electronic components, said structure comprising:
   a support layer having a first side and a second side opposite said first side, said support layer comprising:
   an island formed of a conductive material,
   an isolation ring formed of a dielectric material and surrounding said island, and
   a portion formed of said conductive material and surrounding said isolation ring;
   a first compound layer formed on said first side of said support layer, said first compound layer having:
   a first dielectric layer,
   a first via hole formed in said first dielectric layer at a first location adjacent said island, and
   a first conductive element located in said first via hole in electrical contact with said island;
   a first conductive layer formed on said first compound layer, said first conductive layer comprising a plurality of first traces, a predetermined one of said first traces being formed in electrical contact with said first conductive element;
   a second compound layer formed on said second side of said support layer, said second compound layer having:
   second dielectric layer,
   a second via hole formed in said second dielectric layer at a second location adjacent said island, and
   a second conductive element located in said second via hole in electrical contact with said island; and
   a second conductive layer formed on said second compound layer, said second conductive layer comprising a plurality of second traces, a predetermined one of said second traces being formed in electrical contact with said second conductive element such that said predetermined one of said second traces is electrically coupled to said pedetermined one of said first traces through said second conductive element, said island and said first conductive element;
   wherein said support layer has a first thickness greater than a thickness of any layer selected from a group consisting of said first compound layer, said first conductive layer, said second compound layer and said second conductive layer, to thereby provide structural support for each of said layers in said group.

2. The structure of claim 1 wherein said island is shaped approximately as a frustum of a cone.

3. The structure of claim 1 wherein each of said first dielectric layer and said second dielectric layer is formed of a material comprising a photoimageable dielectric material.

4. The structure of claim 1 wherein said island is shaped approximately as a solid cylinder.

5. The structure of claim 4 wherein each of said first conductive element and said second conductive element is formed approximately in the center of said first via hole and said second via hole respectively.

6. The structure of claim 4 wherein each of said first conductive element and said second conductive element comprises binding material densely populated with a plurality of conductive particles, each of said conductive particles being in electrical contact with at least another of said conductive particles.

7. The structure of claim 1 wherein said island is formed by etching a sheet of said conductive material.

8. The structure of claim 1 wherein each of said isolation ring, said first dielectric layer and said second dielectric layer are formed of a photoimageable dielectric material.

9. The structure of claim 1 wherein said conductive material comprises a metal.

10. The structure of claim 1 wherein each of said first conductive layer and said second conductive layer is formed by lamination.

11. An integrated circuit package comprising as multilayered structure comprising:
   a support layer having a first side and a second side opposite said first side, said support layer comprising an island formed of a conductive material, an isolation ring formed of a dielectric material and surrounding said island, and a portion formed of said conductive material and surrounding said isolation ring;
   a first compound layer formed on said first side of said support layer, said first compound layer having a first dielectric layer, a first via hole formed in said first dielectric layer at a first location adjacent said island, and a first conductive element located in said first via hole in electrical contact with said island;
   a first conductive layer formed on said first compound layer, said first conductive layer comprising a plurality of first contacts, a predetermined one of said first contacts being formed in electrical contact with said first conductive element;
   a second compound layer formed on said second side of said support layer, said second compound layer having a second dielectric layer, a second via hole formed in said second dielectric layer at a second location adjacent said conductive island, and a second conductive element located in said second via hole in electrical contact with said island;
   a second conductive layer formed on said second compound layer, said second conductive layer comprising a plurality of second contacts, a predetermined one of said second contacts being formed in electrical contact with said second conductive element such that said predetermined one of said second contacts is electrically coupled to said predetermined one of said first contacts through at least said second conductive element, said island and said first conductive element;
   wherein said support layer has a first thickness greater than a thickness of any layer selected from a group consisting of said first compound layer, said first conductive layer, said second compound layer and said second conductive layer, to thereby provide structural support for each of said layers in said group;
   a plurality of substrate balls, each of said substrate balls being formed in electrical contact with one of said second contacts, a a first one of said substrate balls being formed in electrical contact with said predetermined one of said second contacts;
   a plurality of die connectors, each of said die connectors being coupled to one of said first contacts such that a predetermined one of said die connectors is electrically coupled by said predetermined one of said first contacts.

12. The package of claim 11 wherein said first conductive layer further comprises a plurality of first traces, a predetermined one of said first traces being coupled to said predetermined one of said first contacts and to said first conductive element.

13. The package of claim 11 wherein each of said die connectors is a conductive ball.

14. The package of claim 11 wherein each of said die connectors is a bond wire.

15. The package of claim 11 wherein:
at least said portion of said support layer is electrically coupled to another one of said second contacts; and
said another one of said second contacts carries an electrical signal at a ground reference voltage during operation of said package.

16. A structure for supporting one or more electronic components, said structure comprising:
- a support layer having a first side and a second side opposite said first side, said support layer comprising:
  - an island formed of a conductive material,
  - an isolation ring formed of a dielectric material and surrounding said island, and
  - a portion formed of said conductive material and surrounding said isolation ring;
- a first compound layer formed on said first side of said support layer, said first compound layer having:
  - a first dielectric layer,
  - a first via hole formed in said first dielectric layer at a first location adjacent said island, and
  - a first conductive element located in said first via hole in electrical contact with said island;
- a first conductive layer formed on said first compound layer, said first conductive layer comprising a plurality of first contacts, a predetermined one of said first contacts being formed in electrical contact with said first conductive element;
- wherein each of said first contacts is predetermined for attachment to a substrate ball and said island is predetermined for attachment to a die connector supported by said second side of said support layer.

17. The structure of claim 16 further comprising:
a second compound layer formed on said second side of said support layer, said second compound layer having:
  - a second dielectric layer,
  - a second via hole formed in said second dielectric layer at a second location adjacent said island, and
  - a second conductive element located in said second via hole in electrical contact with said island; and
a second conductive layer formed on said second compound layer, said second conductive layer comprising a plurality of second traces, a predetermined one of said second traces being formed in electrical contact with said second conductive element such that said predetermined one of said second traces is electrically coupled to said predetermined one of said first contacts through said second conductive element, said island and said first conductive element.

18. The structure of claim 16 wherein said conductive material in said island comprises binding material densely populated with a plurality of conductive particles, each of said conductive particles being in electrical contact with at least another of said conductive particles.

19. The structure of claim 16 wherein said support layer is formed by plating.

20. The structure of claim 16 further comprising:
a second compound layer formed on said second side of said support layer, said second compound layer having:
  - a second dielectric layer,
  - a second via hole formed in said second dielectric layer at a second location adjacent said island, and
  - a second conductive element located in said second via hole in electrical contact with said island; and
a second conductive layer formed on said second compound layer, said second conductive layer comprising a plurality of second contacts, a predetermined one of said second contacts being formed in electrical contact with said second conductive element such that said predetermined one of said second contacts is electrically coupled to said predetermined one of said first contacts through said second conductive element, said island and said first conductive element.

* * * * *